United States Patent
Wang et al.

(10) Patent No.: US 9,631,273 B2
(45) Date of Patent: Apr. 25, 2017

(54) APPARATUS FOR DIELECTRIC DEPOSITION PROCESS

(75) Inventors: Lan-Hai Wang, Zhubei (TW); Ding-I Liu, Hsin-Chu (TW); Si-Wen Liao, Hsin-Chu (TW); Po-Hsiung Leu, Lujhu Township (TW); Yong-Hung Yang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 740 days.

(21) Appl. No.: 13/557,904

(22) Filed: Jul. 25, 2012

(65) Prior Publication Data

US 2014/0026813 A1 Jan. 30, 2014

(51) Int. Cl.
*C23C 16/40* (2006.01)
*C23C 16/455* (2006.01)
*C23C 16/50* (2006.01)

(52) U.S. Cl.
CPC ........ *C23C 16/401* (2013.01); *C23C 16/4557* (2013.01); *C23C 16/45574* (2013.01); *C23C 16/50* (2013.01)

(58) Field of Classification Search
CPC ............ C23C 16/401; C23C 16/45574; C23C 16/4557; C23C 16/50
See application file for complete search history.

(56) References Cited

U.S. PATENT DOCUMENTS

| | | | |
|---|---|---|---|
| 5,531,183 A * | 7/1996 | Sivaramakrishnam et al. ............... | 438/784 |
| 5,862,057 A * | 1/1999 | Xia et al. ..................... | 716/50 |
| 6,110,283 A * | 8/2000 | Yamamuka et al. .......... | 118/715 |
| 2002/0059904 A1* | 5/2002 | Doppelhammer ........................ C23C 16/45565 | 118/715 |
| 2003/0101938 A1* | 6/2003 | Ronsse ................. C23C 16/407 | 118/726 |
| 2005/0045099 A1* | 3/2005 | Bencher et al. .............. | 118/715 |
| 2005/0106763 A1* | 5/2005 | Hsieh et al. ..................... | 438/5 |
| 2005/0263248 A1* | 12/2005 | Rocha-Alvarez ... C23C 16/4405 | 156/345.34 |
| 2007/0131168 A1* | 6/2007 | Gomi et al. ................... | 118/715 |
| 2007/0275568 A1* | 11/2007 | Miyoshi et al. .............. | 438/778 |
| 2009/0117746 A1* | 5/2009 | Masuda ............ C23C 16/45561 | 438/710 |
| 2010/0116788 A1* | 5/2010 | Singh ................... C23C 16/4586 | 216/66 |
| 2011/0030615 A1* | 2/2011 | Griffin et al. ................. | 118/666 |
| 2011/0033966 A1* | 2/2011 | Su ......................... C23C 16/303 | 438/47 |
| 2011/0052833 A1* | 3/2011 | Hanawa .............. C23C 16/4404 | 427/534 |
| 2012/0000490 A1* | 1/2012 | Chung .................. B08B 7/0035 | 134/22.12 |

(Continued)

*Primary Examiner* — Jeffrie R Lund

(74) *Attorney, Agent, or Firm* — Slater Matsil, LLP

(57) ABSTRACT

An apparatus comprises a first gas inlet coupled between a first pipe and a reaction chamber, wherein the first pipe configured to carry process gases, a second gas inlet coupled between a second pipe and the reaction chamber, wherein the second pipe configured to carry a precursor material in a gaseous state and a heating device coupled to the second pipe and the second gas inlet, wherein the heating device keeps an ambient temperature of the second pipe and the second gas inlet above a boiling point of the precursor material.

19 Claims, 2 Drawing Sheets

(56) References Cited

U.S. PATENT DOCUMENTS

| | | | |
|---|---|---|---|
| 2012/0052216 A1* | 3/2012 | Hanawa | C23C 16/45565 427/582 |
| 2014/0026813 A1* | 1/2014 | Wang | C23C 16/401 118/723 R |
| 2016/0053376 A1* | 2/2016 | Nam | C23C 16/45565 216/71 |

* cited by examiner

APPARATUS FOR DIELECTRIC DEPOSITION PROCESS

BACKGROUND

In the manufacturing process of thin semiconductor devices, an important step is depositing a thin oxide layer to provide insulation between conductive layers. For example, a thin oxide layer is formed between a polysilicon gate electrode and the substrate underneath the gate electrode. The thin oxide layer functions as an insulating layer. The thin oxide layer may be formed by suitable fabrication techniques.

The commonly used oxide layer fabrication techniques can be divided into two categories. The first category includes a variety of film growth processes through interaction of a vapor deposited species with the top surface of a substrate. For example, a thermal oxidation process represents a typical implementation of the first category. The thermal oxidation process may further be divided into two subclasses, namely dry oxidation and wet oxidation. In a dry oxidation process, the surface of a substrate is exposed to an oxidizing ambient environment comprising pure $O_2$, and as a result, a $SiO_2$ layer is formed on top of the substrate through interaction between $O_2$ and the silicon surface of the substrate. In contrast, in a wet oxidation process, the substrate is exposed to an oxidizing ambient environment comprising steam or water vapor.

The second category of oxide layer fabrication techniques may include a deposition process without causing changes to the top surface of the substrate. The second category includes a variety of suitable fabrication processes such as a chemical vapor deposition (CVD) process, a physical vapor deposition (PVD) process, a plasma enhanced CVD (PECVD) process and the like.

In a PECVD process, due to good conformal step coverage and gap filling characteristics, tetraethoxysilane gas ($Si(OC_2H_5)_4$) is used as a source material of silicon. Tetraethoxysilane gas is commonly known as TEOS. Throughout the description, for simplicity, Tetraethoxysilane is alternatively referred to as TEOS.

According to the fabrication steps of a PECVD process, a wafer may be placed in a reaction chamber. A gas combining TEOS and other suitable process gases such as oxygen ($O_2$), ozone ($O_3$) or the like are fed into the reaction chamber through a manifold. In the reaction chamber, $Si(OC_2H_5)_4$ reacts with $O_2$ to generate SiO2 and corresponding byproducts. The PECVD based oxide deposition is carried out at a temperature range from about 250 degrees to about 450 degrees and a pressure level from about 2 torr to about 10 torr.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

The present disclosure will be described with respect to embodiments in a specific context, namely a manifold for a plasma enhanced chemical vapor deposition (PECVD) process. The embodiments of the disclosure may also be applied, however, to a variety of semiconductor fabrication processes. Hereinafter, various embodiments will be explained in detail with reference to the accompanying drawings.

Figure 1:
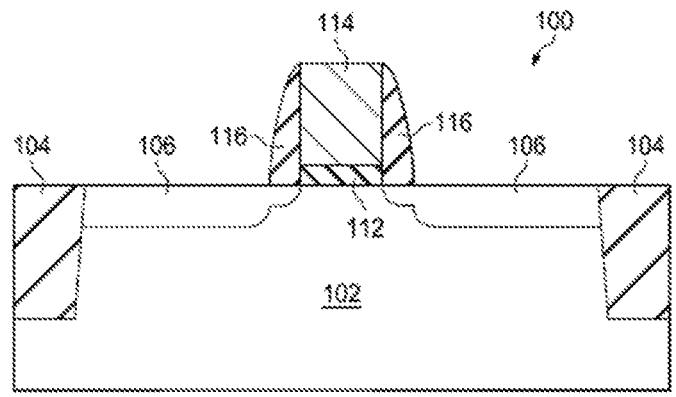
FIG. 1 illustrates a cross sectional view of a metal oxide semiconductor (MOS) transistor in accordance with an embodiment.

FIG. 1 illustrates a cross sectional view of a metal oxide semiconductor (MOS) transistor in accordance with an embodiment. The MOS transistor 100 is formed in a substrate 102. The MOS transistor 100 includes two drain/source regions 106, which are formed on opposite sides of a gate stack. The gate stack includes a gate dielectric layer 112 formed over the substrate 102, a gate electrode formed over the gate dielectric layer 112 and gate spacers 116. As shown in FIG. 1, there may be two isolation regions 104 formed on opposite sides of the MOS transistor 100.

The substrate 102 may be formed of silicon, although it may also be formed of other group III, group IV, and/or group V elements, such as silicon, germanium, gallium, arsenic, and combinations thereof. The substrate 102 may also be in the form of bulk substrate or silicon-on-insulator (SOI). Other substrates that may be used include multi-layered substrates, gradient substrates, or hybrid orientation substrates.

The isolation regions 104 may be shallow trench isolation (STI) regions, and may be formed by etching the substrate 102 to form a trench and filling the trench with a dielectric material as is known in the art. The isolation regions 104 may be filled with a dielectric material such as an oxide material, a high-density plasma (HDP) oxide, or the like, formed by conventional methods known in the art.

The gate dielectric 112 may be a dielectric material, such as silicon oxide, silicon oxynitride, silicon nitride, an oxide, a nitrogen-containing oxide, a combination thereof or the like. The gate dielectric 112 may have a relative permittivity value greater than about 4. Other examples of such materials include aluminum oxide, lanthanum oxide, hafnium oxide, zirconium oxide, hafnium oxynitride, or combinations thereof. In an embodiment in which the gate dielectric 112 comprises an oxide layer, the gate dielectrics 112 may be formed by a plasma enhanced chemical vapor deposition (PECVD) process using tetraethoxysilane (TEOS) and oxygen as a precursor. In accordance with an embodiment, the gate dielectric 112 may be of a thickness in a range from about 8 Å to about 200 Å. The detailed process and system configuration of a PECVD based oxide deposition will be described below with respect to FIG. 2 and FIG. 3.

The gate electrode 114 may comprise a conductive material, such as a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), doped poly-crystalline silicon, other conductive materials, combinations thereof, or the like. In an embodiment in which the gate electrode 114 is poly-silicon, the gate electrode 114 may be formed by depositing doped or undoped poly-silicon by low-pressure chemical vapor deposition (LPCVD) to a thickness in the range of about 400 Å to about 2,400 Å, such as about 1,400 Å.

The spacers 116 may be formed by blanket depositing one or more spacer layers (not shown) over the gate electrode 114 and the substrate 102. The spacer layers 116 may comprise SiN, oxynitride, SiC, SiON, oxide, and the like. The spacer layers 116 may be formed by commonly used methods such as chemical vapor deposition (CVD), PECVD, sputter, and other methods known in the art.

The drain/source regions 106 may be formed in the substrate 102 on opposing sides of the gate dielectric 112. In an embodiment in which the substrate 102 is an n-type substrate, the drain/source regions 106 may be formed by implanting appropriate p-type dopants such as boron, gallium, indium or the like. Alternatively, in an embodiment in which the substrate 102 is a p-type substrate, the drain/source regions 106 may be formed by implanting appropriate n-type dopants such as phosphorous, arsenic, or the like.

Figure 2:
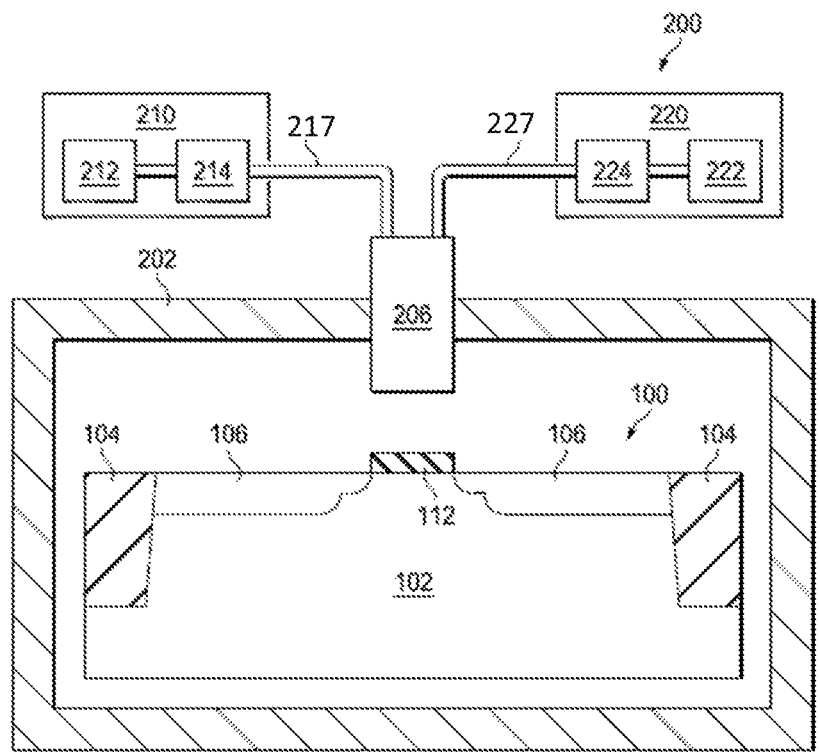
FIG. 2 illustrates a plasma enhanced chemical vapor deposition (PECVD) based deposition system that may be utilized to form the gate dielectric layer of the MOS transistor shown in FIG. 1.

FIG. 2 illustrates a PECVD based deposition system that may be utilized to form the gate dielectric layer of the MOS transistor shown in FIG. 1 in an embodiment. As shown in FIG. 2, the PECVD based deposition system 200 may include a reaction chamber 202 and two gas delivery systems, namely a first gas delivery system 210 and a second gas delivery system 220. A semiconductor wafer comprising the MOS transistor 100 is placed within the reaction chamber 202. The reaction chamber is coupled to the first gas delivery system 210 and the second gas delivery system 220 through a manifold 206. In particular, the output of the first gas delivery system 210 is coupled to an exterior side of the manifold 206 through a pipe 217. Likewise, the output of the second gas delivery system 220 is coupled to an exterior side of the manifold 206 through a pipe 227.

In accordance with an embodiment, the first gas delivery system 210 may include a first gas source 212 and a first flow controller 214. The first gas source 212 may supply a variety of process gases such as a carrier that may be used to facilitate the transportation of the precursor gas to the reaction chamber 202. The process gases may include a variety of suitable gases such as oxygen ($O_2$), ozone ($O_3$), nitrogen ($N_2$), helium (He), argon (Ar), hydrogen ($H_2$), combinations of these or the like.

The first gas source 212 may supply the desired process gas to the first flow controller 214. The first flow controller 214 may be utilized to control the flow of the process gas to the reaction chamber 202. The first flow controller 214 may be a suitable gas valve such as a proportional valve, a modulating valve, a needle valve, a pressure regulator, a mass flow controller, combinations of these or the like.

The second gas delivery system 220 may comprise a second gas source 222 and a second flow controller 224. The second gas source 222 may comprise a precursor material such as TEOS, triethylborate (TEB) and triethylphosphate (TEPO) or the like. In accordance with an embodiment, the precursor material is TEOS, which has been vaporized during a preparation stage (not shown). The vaporized TEOS may stay in a gaseous state if the ambient temperature is more than its boiling point, which is in a range from about 163 degrees to about 167 degrees. TEOS in a gaseous state is pursued in an oxidation process because TEOS in a liquefied or solidified state may cause an uneven surface of the oxide layer. In order to achieve a high quality oxide deposition process, the ambient temperatures of the second gas source 222, the second flow controller 224 and the pipe 227 should be kept above the boiling point of TEOS.

As shown in FIG. 2, the second gas source 222 may supply vaporized TEOS to the second flow controller 224. The second flow controller 224 in the second gas delivery system 220 may help the second gas delivery system control the flow of the precursor material TEOS to the reaction chamber 202. The second flow controller 224 may be implemented by a proportional valve, a modulating valve, a needle valve, a pressure regulator, a mass flow controller, a combination of these, or the like.

The first gas delivery system 210 and the second gas delivery system 220 may supply process gases into the reaction chamber 202 through the manifold 206. As shown in FIG. 2, the manifold 206 may have a first side built outside the wall of the reaction chamber 202 and a second side built inside the reaction chamber 202. The second side of the manifold 206 may comprise a showerhead (not shown). The showerhead may be utilized to disperse the precursor material into the reaction chamber 202.

The reaction chamber 202 may receive the desired precursor materials and expose the precursor materials to the semiconductor wafer including the MOS transistor 100. The reaction chamber 202 may be any desired shape that may be suitable for dispersing the precursor materials on top of the semiconductor wafer including the MOS transistor 100. The walls of the reaction chamber 202 may be formed of suitable materials that are inert to the various process gases. The materials of the walls of the reaction chamber 200 include steel, stainless steel, nickel, aluminum, alloys of these, or combinations of these and the like.

Figure 3:
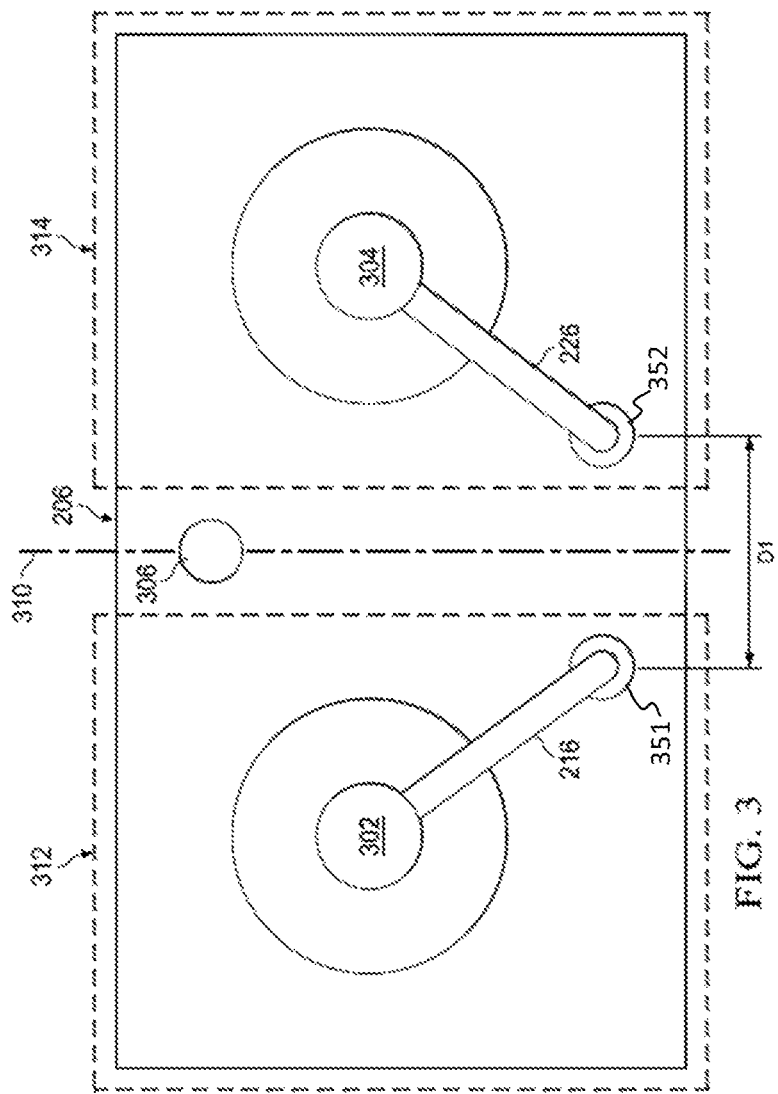
FIG. 3 illustrates a configuration of the pipes of the manifold shown in FIG. 2 in accordance with an embodiment.

FIG. 3 illustrates a configuration of the pipes of the manifold shown in FIG. 2 in accordance with an embodiment. As shown in FIG. 3, the manifold 206 may be divided into two portions, namely a first portion 312 and a second portion 314. The structures on the first portion 312 and the structures of the second portion 314 are symmetrical relative to a middle dashed line 310. The first portion 312 may be dedicated to supplying process gases such as nitrogen, oxygen and the like. The second portion 314 may be dedicated to supplying precursor materials such as vaporized TEOS and the like.

As shown in FIG. 3, the manifold 206 may include two gas inlets, namely a first gas inlet 302 and a second gas inlet 304, which are located at the first portion 312 and the second portion 314 respectively. Process gases such as oxygen, nitrogen and the like may be fed into the reaction chamber 202 (not shown but illustrated in FIG. 2) through a first pipe 216, which is connected to the first gas inlet 302 and a first gas input terminal 351. As shown in FIG. 3, the first pipe 216 is oriented to a first direction. Likewise, precursor materials such as TEOS and the like may be fed into the reaction chamber 202 through a second pipe 226, which is connected to the second gas inlet 304 and a second gas input terminal 352. As shown in FIG. 3, the second pipe 226 is oriented to a second direction. It should be noted that the first direction and the second direction shown in FIG. 3 are symmetrical relative to the middle dashed line 310.

The second portion 314 may further comprise a heating device (not shown), which is capable of keeping the temperature of the second pipe 226 and the second gas inlet 304 up to a boiling point of the precursor material carried by the second pipe 226. In accordance with an embodiment, the precursor material may be TEOS, which has a boiling point between 163 degrees and 167 degrees. The heating device may keep the second portion 314 including the second pipe 226 and the second gas inlet 304 up to the boiling point of TEOS or at least 160 degrees.

In order to prevent the process gases from cooling down the precursor materials such as vaporized TEOS, the layout of the first pipe 216, the second pipe 226, the first gas inlet 302 and the second gas inlet 304 are so configured that they are symmetrical relative to the middle dashed line 310. As such, the first pipe 216 is separated from the second pipe 226 by a minimum distance D1. In accordance with an embodiment, the minimum distance D1 is approximately equal to 20 mm.

As shown in FIG. 3, the manifold 206 may further comprise a third inlet 306 located between the first inlet 302 and the second inlet 304. In accordance with an embodiment, the third inlet 306 is employed to supply cycling water for cooling down the reaction chamber 202.

It should be noted that the dimensions and the shapes shown in FIG. 3 are selected purely for demonstration purposes and are not intended to limit the various embodiments of the present invention to any particular size dimensions and shapes.

Conventional manifolds may comprise three inlets, namely the process gas inlet, the precursor material inlet and the cycling water inlet. These three inlets are formed adjacent to each other. As a result, either the cycling water or the process gas may cool down the vaporized TEOS so that the TEOS gas may be liquefied or even solidified. Such liquefied or solidified TEOS may block the precursor material supply channel so as to prevent the oxide deposition system from generating a uniform oxide layer.

In contrast with conventional manifolds, the manifold 206 shown in FIG. 3 may be approximately equivalent to two conventional manifolds formed next to each other. The first portion 312 of the manifold 206 has a structure similar to a conventional manifold except that there may be a single inlet dedicated to supplying process gases. Likewise, the second portion 314 of the manifold 206 has a structure similar to a conventional manifold except that there may be a single inlet dedicated to supplying vaporized TEOS. In addition, the second portion 314 may be of a self-heating type, through which the ambient temperature of vaporized TEOS is kept over the boiling point of TEOS. In accordance with an embodiment, the boiling point of TEOS is in a range from about 163 degrees to about 167 degrees.

One advantageous feature of having the manifold 206 shown in FIG. 3 is that the oxide layer generated in a PECVD based oxide deposition may be of a uniform surface prior to applying a chemical mechanical polish (CMP) process. In accordance with an embodiment, by employing the manifold 206 shown in FIG. 3, the thickness variation of an oxide layer through a PECVD based oxidation process is within 2 Å. Under the same deposition conditions, the thickness variation of an oxide layer using conventional manifolds may be up to 10 Å. Therefore, the manifold 206 shown in FIG. 3 helps to improve the dielectric layer fabrication quality. As a result, the semiconductor device's reliability is improved.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A structure comprising:
a first gas inlet in a manifold and coupled between a first pipe and a reaction chamber, wherein the first pipe is connected to a first gas input terminal on a top surface of the manifold, wherein the first pipe is configured to carry process gases, wherein the manifold has a first side outside the reaction chamber and a second side inside the reaction chamber;
a second gas inlet in the manifold and coupled between a second pipe and the reaction chamber, wherein the second pipe is connected to a second gas input terminal on a top surface of the manifold and configured to carry a precursor material in a gaseous state; and
a heating device in the manifold and coupled to the second pipe and the second gas inlet, wherein the heating device keeps an ambient temperature of the second pipe and the second gas inlet above a boiling point of the precursor material and wherein in order to prevent the process gases from cooling down the precursor material in the second pipe and the second gas inlet, the first pipe, the first gas inlet, the second pipe and the second gas inlet are configured such that a distance between the first gas inlet and the second gas inlet is greater than a distance between the first gas input terminal and the second gas input terminal, and wherein the first pipe and the second pipe are spaced apart and symmetrical with respect to a center line between the first gas inlet and the second gas inlet.

2. The structure of claim 1, further comprising:
a third inlet coupled to the reaction chamber, wherein the third inlet is located between the first gas inlet and the second gas inlet.

3. The structure of claim 1, wherein:
the first pipe and the second pipe are separated by a first distance greater than about 20 mm.

4. The structure of claim 1, wherein:
the first gas inlet and the second gas inlet are separated by a second distance greater than about 20 mm.

5. The structure of claim 1, wherein: the process gases include oxygen, ozone, or nitrogen.

6. The structure of claim 1, wherein:
the precursor material is selected from the group consisting of tetraethoxysilane (TEOS), triethylborate (TEB) and triethylphosphate (TEPO).

7. The structure of claim 1, wherein:
the boiling point is in a range from about 163 degrees to about 167 degrees.

8. An apparatus comprising:
a first inlet coupled to a chamber and located at a first middle point of a first half of a manifold, wherein the manifold has a first side outside the chamber and a second side inside the chamber;
a first pipe coupled between a process gas input terminal and the first inlet, wherein:
the first pipe is oriented to a first direction and configured to carry process gases; and
the first pipe is on a top surface of the manifold;
a second inlet coupled to the chamber and located at a second middle point of a second half of the manifold;
a second pipe coupled between a precursor gas input terminal and the second inlet, wherein:
the second pipe is oriented to a second direction and configured to carry a precursor material, wherein:
the second pipe is on the top surface of the manifold;
the first direction and the second direction are symmetrical relative to a divisional line between the first half and the second half of the manifold, and the first inlet, the second inlet, the process gas input terminal and the precursor gas input terminal form a trapezoidal shape; and
a heating device in the second half of the manifold and coupled to the second pipe and the second inlet, wherein a distance from the first inlet to the heating device is greater than a distance from the second inlet to the heating device, and wherein the heating device keeps an ambient temperature of the second pipe and the second inlet above a boiling point of the precursor material and wherein in order to prevent the process gases from cooling down the precursor material in the second pipe and the second inlet, the first pipe, the first inlet, the second pipe and the second inlet are configured such that a distance between the first inlet and the second inlet is greater than a distance between the process gas input terminal and the precursor gas input terminal, and wherein the first pipe and the second pipe are spaced apart and symmetrical with respect to the divisional line.

9. The apparatus of claim 8, wherein:
the chamber is configured to carry out a plasma enhanced chemical vapor deposition (PECVD) process.

10. The apparatus of claim 8, wherein:
the process gas input terminal and the precursor gas input terminal are separated by a first distance greater than about 20 mm.

11. The apparatus of claim 8, wherein:
a cycling water inlet located between the first inlet and the second inlet, wherein the cycling water inlet is located at the divisional line between the first half and the second half of the manifold.

12. The apparatus of claim 8, wherein:
the chamber is formed of a material selected from the group consisting of steel, stainless steel, nickel, aluminum and alloys thereof.

13. The apparatus of claim 8, wherein:
the first pipe and the second pipe have a first minimum distance greater than about 20 mm.

14. The apparatus of claim 8, wherein:
the first inlet and the second inlet have a second minimum distance greater than about 20 mm.

15. A system comprising:
a precursor delivery device comprising:
a precursor source comprising a vaporized precursor material; and
a first flow controller;
a process gas delivery device comprising:
a process gas source comprising a process gas; and
a second flow controller; and
a manifold coupled between the precursor delivery device, the process gas delivery device and a chamber, wherein the manifold has a first side outside the chamber and a second side inside the chamber, and wherein the manifold comprises:
a first gas inlet coupled between a first pipe and the chamber, wherein the first pipe is configured to carry the process gas and connected to a first gas input terminal, and wherein the first pipe and the first gas input terminal are on a top surface of the manifold;
a second gas inlet coupled between a second pipe and the chamber, wherein the second pipe is configured to carry the vaporized precursor material and connected to a second gas input terminal, and wherein the second pipe and the second gas input terminal are on a top surface of the manifold;
a cycling water inlet located between the first gas inlet and the second gas inlet, wherein the cycling water inlet, the first gas inlet and the second gas inlet form an isosceles triangle; and
a heating device coupled to the second pipe and the second gas inlet, wherein the heating device keeps an ambient temperature of the second pipe and the second gas inlet above a boiling point of the vaporized precursor material and wherein in order to prevent the process gas from cooling down the vaporized precursor material in the second pipe and the second gas inlet, the first pipe, the first gas inlet, the second pipe and the second gas inlet are configured such that a distance between the first gas inlet and the second gas inlet is greater than a distance between the first gas input terminal and the second gas input terminal, and wherein the first pipe and the second pipe are spaced apart and symmetrical with respect to a center line between the first gas inlet and the second gas inlet.

16. The system of claim 15, wherein:
the first flow controller and the second flow controller are selected from the group consisting of a proportional valve, a modulating valve, a needle valve, a pressure regulator and a mass flow controller.

17. The system of claim 15, further comprising:
a showerhead coupled to the first gas inlet and the second gas inlet, wherein the showerhead disperses the vaporized precursor material.

18. The system of claim 15, wherein:
the cycling water inlet and the second gas inlet are separated by a distance greater than about 20 mm.

19. The system of claim 15, wherein:
the vaporized precursor material comprises tetraethoxysilane (TEOS).

* * * * *